(12) United States Patent
Ishida

(10) Patent No.: US 11,978,608 B2
(45) Date of Patent: May 7, 2024

(54) ION GENERATION DEVICE AND ION GENERATION METHOD

(71) Applicant: SUMITOMO HEAVY INDUSTRIES ION TECHNOLOGY CO., LTD., Tokyo (JP)

(72) Inventor: Yuuji Ishida, Ehime (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 583 days.

(21) Appl. No.: 17/201,436

(22) Filed: Mar. 15, 2021

(65) Prior Publication Data

US 2021/0296078 A1    Sep. 23, 2021

(30) Foreign Application Priority Data

Mar. 18, 2020    (JP) .................... 2020-047762

(51) Int. Cl.
| | |
|---|---|
| *H01J 37/08* | (2006.01) |
| *H01J 37/18* | (2006.01) |
| *H01J 37/317* | (2006.01) |
| *H01J 37/32* | (2006.01) |

(52) U.S. Cl.
CPC ............. *H01J 37/08* (2013.01); *H01J 37/18* (2013.01); *H01J 37/3171* (2013.01); *H01J 37/32064* (2013.01); *H01J 37/32614* (2013.01); *H01J 37/32954* (2013.01)

(58) Field of Classification Search
CPC ........ H01J 37/08; H01J 37/18; H01J 37/3171; H01J 37/32064; H01J 37/32614; H01J 37/32954; H01J 2237/31705; H01J 37/05; H01J 37/075; H05H 1/34
See application file for complete search history.

(56) References Cited

U.S. PATENT DOCUMENTS

| | | | |
|---|---|---|---|
| 5,270,250 A | 12/1993 | Murai et al. | |
| 5,861,630 A * | 1/1999 | Becker | H01J 37/08 250/424 |
| 6,593,580 B2 | 7/2003 | Miyabayashi | |
| 10,283,326 B2 | 5/2019 | Kawaguchi | |
| 2015/0043599 A1* | 2/2015 | Yanagida | H01S 3/1118 372/18 |
| 2016/0053359 A1* | 2/2016 | Heuer | C21D 1/06 118/723 R |
| 2019/0326722 A1* | 10/2019 | Kawasuji | H01S 3/034 |
| 2021/0026254 A1* | 1/2021 | Kobayashi | G03F 7/70041 |

FOREIGN PATENT DOCUMENTS

| | | |
|---|---|---|
| JP | H05-102058 A | 4/1993 |
| JP | 2002-324493 A | 11/2002 |
| JP | 2007-266022 A | 10/2007 |
| JP | 2012-018920 A | 1/2012 |
| JP | 2012-142248 A | 7/2012 |
| JP | 2017-091906 A | 5/2017 |

* cited by examiner

*Primary Examiner* — Renan Luque
(74) *Attorney, Agent, or Firm* — Michael Best & Friedrich LLP

(57) ABSTRACT

There is provided an ion generation device including a plasma generation chamber that generates a plasma for extracting an ion, and a heating device configured to heat the plasma generation chamber by irradiating a member that defines the plasma generation chamber or a member that is to be exposed to the plasma generated inside the plasma generation chamber with a laser beam.

15 Claims, 6 Drawing Sheets

ION GENERATION DEVICE AND ION GENERATION METHOD

RELATED APPLICATIONS

The content of Japanese Patent Application No. 2020-047762, on the basis of which priority benefits are claimed in an accompanying application data sheet, is in its entirety incorporated herein by reference.

BACKGROUND

Technical Field

Certain embodiments of the present invention relate to an ion generation device and an ion generation method.

Description of Related Art

In a semiconductor manufacturing process, a process of implanting ions into a semiconductor wafer (also referred to as an ion implantation process) is generally performed in order to change conductivity of a semiconductor, or in order to change a crystal structure of the semiconductor. A device used for the ion implantation process is generally called an ion implanter. The ion implanter includes an ion generation device for converting a source gas into a plasma to generate ions.

In the ion generation device, operation conditions of the ion generation device may be switched in order to change implantation conditions such as an ion species and/or an ion beam current. In a case of the ion generation device using an arc discharge, a chamber (also referred to as an arc chamber) surrounding the plasma is heated due to generation of the plasma by the arc discharge, and comes to have a high temperature (for example, several hundred degrees Celsius or higher). In the related art, when the operation condition such as an arc current is changed, a state of the plasma is changed, and a temperature of the arc chamber is also changed in response to a change in the state of the plasma.

SUMMARY

According to an embodiment of the present invention, there is provided an ion generation device including a plasma generation chamber that generates a plasma for extracting an ion, and a heating device configured to heat the plasma generation chamber by irradiating a member that defines the plasma generation chamber or a member that is to be exposed to the plasma generated inside the plasma generation chamber with a laser beam.

According to another embodiment of the present invention, there is provided an ion generation method. The method includes heating a plasma generation chamber by irradiating a member that defines the plasma generation chamber or a member that is to be exposed to a plasma generated inside the plasma generation chamber with a laser beam, and extracting an ion from the plasma generated inside the plasma generation chamber.

DETAILED DESCRIPTION

Figure 1:
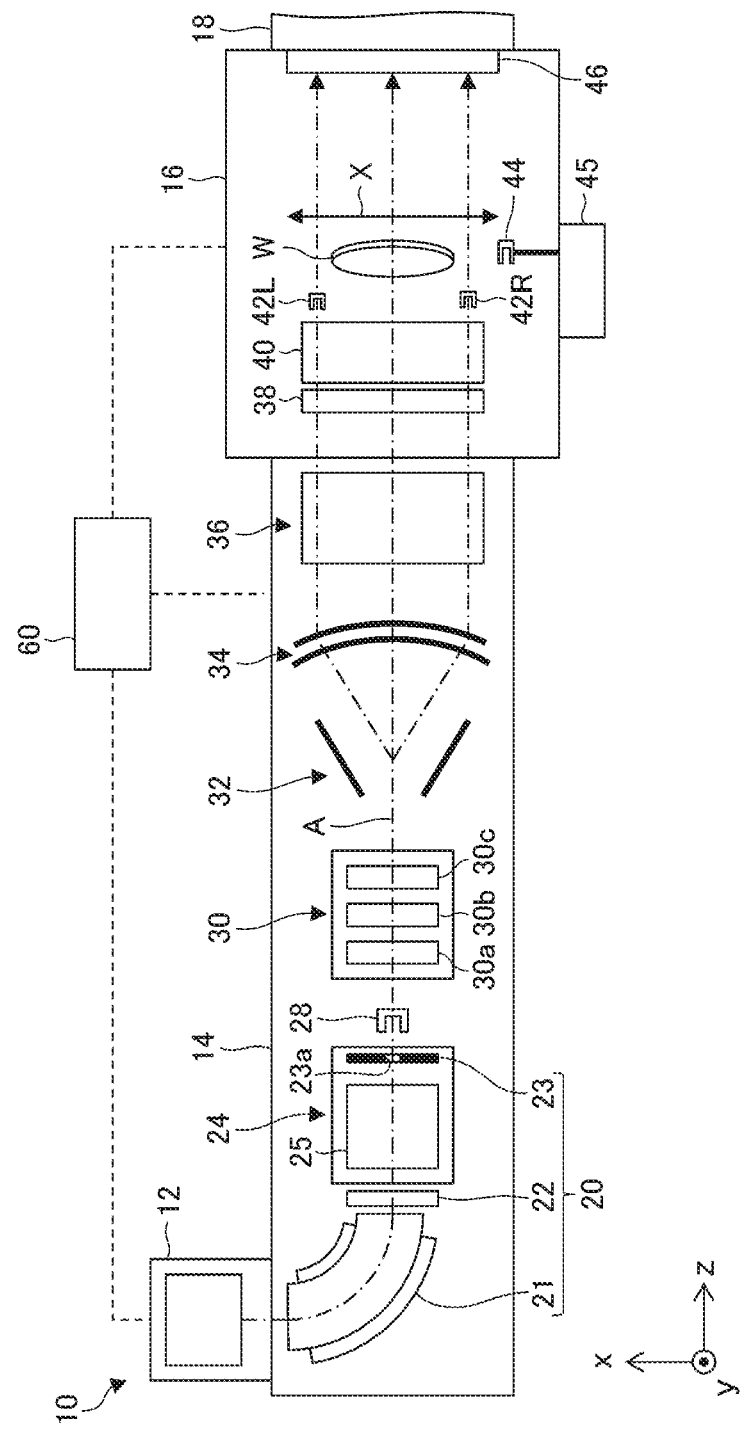
FIG. 1 is a top view illustrating a schematic configuration of an ion implanter according to an embodiment.

In order to stably generate a plasma, it is preferable to maintain an arc chamber at a suitable temperature in accordance with each of operation conditions of an ion generation device. However, the arc chamber has poor temperature responsiveness due to its relatively large heat capacity, and heat loss is significant due to thermal radiation in a high temperature state. Consequently, when the operation conditions are switched, it takes time especially in a case where a temperature of the arc chamber needs to be largely raised to a suitable temperature. In addition, even when the temperature of the arc chamber has been raised to the suitable temperature, a waiting time may be additionally required until plasma generation is stabilized. In this case, a time required for switching the operation conditions is lengthened, and productivity in an ion implantation process is degraded.

It is desirable to provide a technique for improving the productivity in the ion implantation process.

Any desired combination of the above-described components, and those in which the components or expressions according to the present invention are substituted from each other in methods, devices, or systems are effectively applicable as an aspect of the present invention.

Before the embodiments are described in detail, an outline will be described. The present embodiment relates to an ion implanter including an ion generation device. The ion generation device includes a plasma generation chamber that generates a plasma for extracting ions. In order to stably generate the plasma, it is necessary to raise a temperature of the plasma generation chamber to a suitable temperature (for example, 1,000° C. or higher). In the present embodiment, the plasma generation chamber is heated by irradiating a member that defines the plasma generation chamber or a member that is to be exposed to the plasma generated inside the plasma generation chamber with a laser beam. In this manner, temperature raising of the plasma generation chamber is promoted. In this manner, a waiting time required until the plasma generation is stabilized is shortened.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Figure 2:
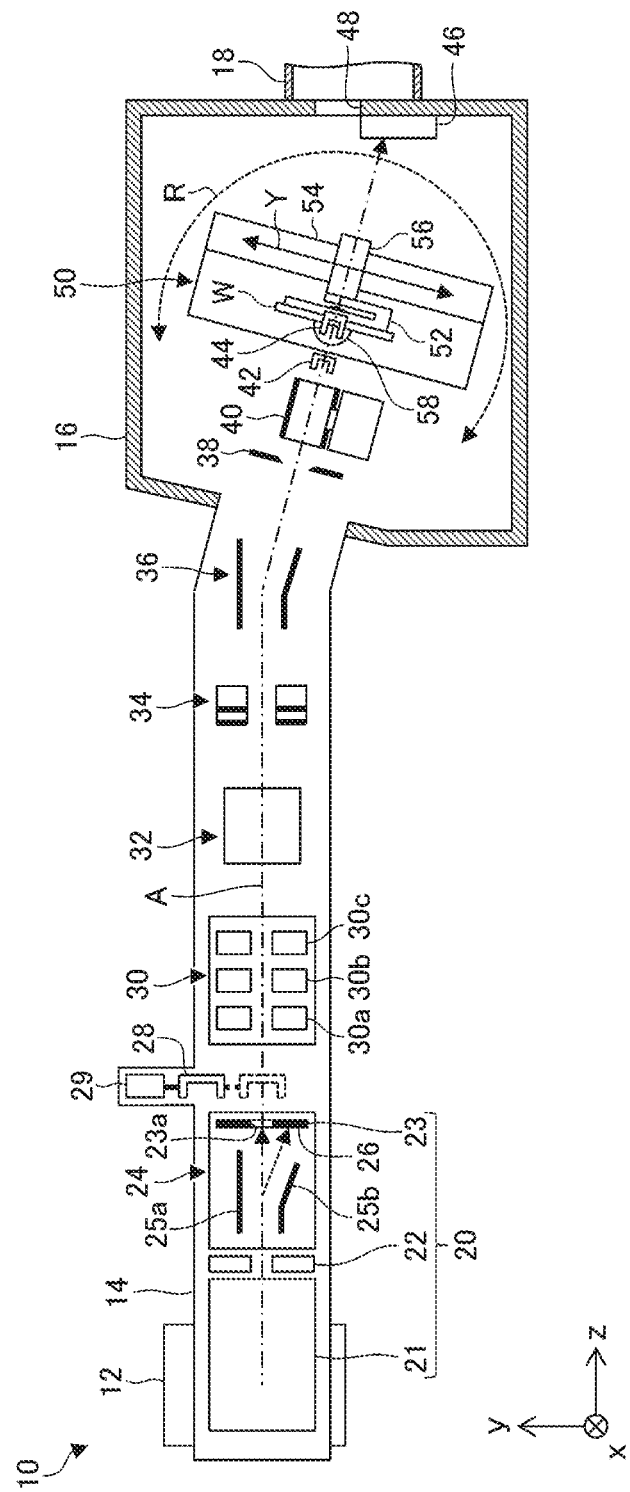
FIG. 2 is a side view illustrating a schematic configuration of the ion implanter in FIG. 1.

FIG. 1 is a top view schematically illustrating an ion implanter 10 according to an embodiment, and FIG. 2 is a side view illustrating a schematic configuration of the ion implanter 10. The ion implanter 10 is configured to perform an ion implantation process into a surface of a workpiece W. For example, the workpiece W is a substrate, or is a semiconductor wafer. For convenience of description, the workpiece W may be referred to as a wafer W in the description herein. However, this is not intended to limit a target of implantation process to a specific object.

The ion implanter 10 is configured to irradiate a whole processing surface of the wafer W with the ion beam by performing reciprocating scanning using the beam in one direction and causing the wafer W to reciprocate in another direction perpendicular to the scanning direction. In the description herein, for convenience of description, a traveling direction of the ion beam which travels along a designed beamline A is defined as a z-direction, and a plane perpendicular to the z-direction is defined as an xy-plane. When the workpiece W is scanned with the ion beam, a scanning direction of the beam is defined as an x-direction, and a direction perpendicular to the z-direction and the x-direction is defined as a y-direction. Therefore, the reciprocating scanning using the beam is performed in the x-direction, and a reciprocating motion of the wafer W is performed in the y-direction.

The ion implanter 10 includes an ion generation device 12, a beamline device 14, an implantation process chamber 16, and a wafer transfer device 18. The ion generation device 12 is configured to provide the ion beam for the beamline device 14. The beamline device 14 is configured to transport the ion beam from the ion generation device 12 to the implantation process chamber 16. The implantation process chamber 16 accommodates the wafer W which is an implantation target, and performs an implantation process of irradiating the wafer W with the ion beam provided from the beamline device 14. The wafer transfer device 18 is configured to load an unprocessed wafer before the implantation process into the implantation process chamber 16, and unload a processed wafer after the implantation process from the implantation process chamber 16. The ion implanter 10 includes a vacuum exhaust system (not illustrated) for providing desired vacuum environments for the ion generation device 12, the beamline device 14, the implantation process chamber 16, and the wafer transfer device 18.

The beamline device 14 includes a mass analyzing unit 20, a beam park device 24, a beam shaping unit 30, a beam scanning unit 32, a beam parallelizing unit 34, and an angular energy filter (AEF) 36, sequentially from an upstream side of the beamline A. The upstream side of the beamline A means a side closer to the ion generation device 12, and a downstream side of the beamline A means a side closer to the implantation process chamber 16 (or a beam stopper 46).

The mass analyzing unit 20 is provided downstream of the ion generation device 12, and is configured to select a required ion species from the ion beam extracted from the ion generation device 12 by performing mass analyzing. The mass analyzing unit 20 has a mass analyzing magnet 21, a mass analyzing lens 22, and a mass analyzing slit 23.

The mass analyzing magnet 21 applies a magnetic field to the ion beam extracted from the ion generation device 12, and deflects the ion beam to travel in different paths in accordance with a value of the mass-to-charge ratio M=m/q (m is mass, and q is charge) of the ions. For example, the mass analyzing magnet 21 applies the magnetic field in the y-direction (−y-direction in FIGS. 1 and 2) to the ion beam so that the ion beam is deflected in the x-direction. Intensity of the magnetic field applied by the mass analyzing magnet 21 is adjusted so that the ion species having a desired mass-to-charge ratio M passes through the mass analyzing slit 23.

The mass analyzing lens 22 is provided downstream of the mass analyzing magnet 21, and is configured to adjust convergence/divergence power for the ion beam. The mass analyzing lens 22 adjusts a focusing position of the ion beam passing through the mass analyzing slit 23 in a beam traveling direction (z-direction), and adjusts a mass resolution M/dM of the mass analyzing unit 20. The mass analyzing lens 22 is not an essential configuration, and the mass analyzing unit 20 may not have the mass analyzing lens 22.

The mass analyzing slit 23 is provided downstream of the mass analyzing lens 22, and is provided at a position away from the mass analyzing lens 22. The mass analyzing slit 23 is configured so that a beam deflecting direction (x-direction) by the mass analyzing magnet 21 coincides with a slit width direction, and has an opening 23a having a shape which is relatively short in the x-direction and relatively long in the y-direction.

The mass analyzing slit 23 may be configured so that the slit width is variable for adjusting the mass resolution. The mass analyzing slit 23 may be configured to include two blockade bodies that are movable in the slit width direction, and may be configured so that the slit width is adjustable by changing an interval between the two blockade bodies. The mass analyzing slit 23 may be configured so that the slit width is variable by switching any one of a plurality of slits having different slit widths.

The beam park device 24 is configured to cause the ion beam to temporarily retreat from the beamline A and to block the ion beam directed to the implantation process chamber 16 (or the wafer W) located downstream. The beam park device 24 can be disposed at any desired position in an intermediate portion of the beamline A. For example, the beam park device 24 can be disposed between the mass analyzing lens 22 and the mass analyzing slit 23. A pre-scribed distance is required between the mass analyzing lens 22 and the mass analyzing slit 23. Accordingly, the beam park device 24 is disposed between both of these. In this manner, a length of the beamline A can be shortened, compared to a case where the beam park device 24 is disposed at another position. Therefore, the whole ion implanter 10 can be reduced in size.

The beam park device 24 includes a pair of park electrodes 25 (25a and 25b) and a beam dump 26. The pair of park electrodes 25a and 25b faces each other across the beamline A, and faces each other in a direction (y-direction) perpendicular to the beam deflecting direction (x-direction) of the mass analyzing magnet 21. The beam dump 26 is provided on the downstream side of the beamline A than the park electrodes 25a and 25b, and is provided away from the beamline A in a facing direction of the park electrodes 25a and 25b.

The first park electrode 25a is disposed on an upper side of the beamline A in a direction of gravity, and the second park electrode 25b is disposed on a lower side of the beamline A in the direction of gravity. The beam dump 26 is provided at a position away to the lower side of the beamline A in the direction of gravity, and is disposed on the lower side of the opening 23a of the mass analyzing slit 23 in the direction of gravity. For example, the beam dump 26 is configured on a portion where the opening 23a of the mass analyzing slit 23 is not formed. The beam dump 26 may be configured to be separate from the mass analyzing slit 23.

The beam park device 24 deflects the ion beam by using an electric field applied between the pair of park electrodes 25a and 25b, and causes the ion beam to retreat from the beamline A. For example, a negative voltage is applied to the second park electrode 25b with an electric potential of the first park electrode 25a as reference. In this manner, the ion beam is deflected downward from the beamline A in the direction of gravity, and is incident into the beam dump 26. In FIG. 2, a trajectory of the ion beam directed toward the beam dump 26 is indicated by a dashed line. The beam park device 24 causes the ion beam to pass toward the downstream side along the beamline A by setting the pair of park electrodes 25a and 25b to have the same electric potential. The beam park device 24 is configured to be operable by switching between a first mode in which the ion beam passes toward the downstream side and a second mode in which the ion beam is incident into the beam dump 26.

An injector Faraday cup 28 is provided downstream of the mass analyzing slit 23. The injector Faraday cup 28 is configured to be movable into and out of the beamline A by an operation of an injector driving unit 29. The injector driving unit 29 moves the injector Faraday cup 28 in a direction (for example, the y-direction) perpendicular to an extending direction of the beamline A. When the injector Faraday cup 28 is disposed on the beamline A as illustrated by a dashed line in FIG. 2, the injector Faraday cup 28 blocks the ion beam directed toward the downstream side. On the other hand, when the injector Faraday cup 28 is removed from the beamline A as illustrated by a solid line in FIG. 2, the blocking of the ion beam directed toward the downstream side is released.

The injector Faraday cup 28 is configured to measure a beam current of the ion beam subjected to mass analyzing by the mass analyzing unit 20. The injector Faraday cup 28 can measure a mass analyzing spectrum of the ion beam by measuring the beam current while changing the intensity of the magnetic field applied by the mass analyzing magnet 21. The mass resolution of the mass analyzing unit 20 can be calculated using the measured mass analyzing spectrum.

The beam shaping unit 30 includes a focusing/defocusing device such as a focusing/defocusing quadrupole lens (Q-lens), and is configured to shape the ion beam which has passed through the mass analyzing unit 20 into a desired cross-sectional shape. For example, the beam shaping unit 30 is configured as an electric field type three-stage quadrupole lens (also referred to as a triplet Q-lens), and has three quadrupole lenses 30a, 30b, and 30c. The beam shaping unit 30 adopts the three lens devices 30a to 30c. Accordingly, the beam shaping unit 30 can independently adjust converging or diverging of the ion beam in the x-direction and the y-direction, respectively. The beam shaping unit 30 may include a magnetic field type lens device, or may include a lens device that shapes the beam by using both an electric field and a magnetic field.

The beam scanning unit 32 is a beam deflection device configured to provide reciprocating scanning using the beam and to perform scanning using the shaped ion beam in the x-direction. The beam scanning unit 32 has a scanning electrode pair facing in a beam scanning direction (x-direction). The scanning electrode pair is connected to variable voltage power supplies (not illustrated), and a voltage applied between the scanning electrode pair is periodically changed. In this manner, an electric field generated between the electrodes is changed so that the ion beam is deflected at various angles. As a result, a whole scanning range is scanned with the ion beam in the x-direction. In FIG. 1, the scanning direction and the scanning range of the ion beam are indicated by an arrow X, and a plurality of trajectories of the ion beam in the scanning range are indicated by one dot chain lines.

The beam parallelizing unit 34 is configured so that the traveling directions of the ion beam used for the scanning become parallel to the trajectory of the designed beamline A. The beam parallelizing unit 34 has a plurality of arc-shaped parallelizing lens electrodes in each of which an ion beam passing slit is provided in a central portion in the y-direction. The parallelizing lens electrodes are connected to high-voltage power supplies (not illustrated), and apply an electric field generated by voltage application to the ion beam so that the traveling directions of the ion beam are parallelized. The beam parallelizing unit 34 may be replaced with another beam parallelizing device, and the beam parallelizing device may be configured to serve as a magnet device using a magnetic field.

An acceleration/deceleration (AD) column (not illustrated) for accelerating or decelerating the ion beam may be provided downstream of the beam parallelizing unit 34.

The angular energy filter (AEF) 36 is configured to analyze energy of the ion beam, to deflect ions having necessary energy downward at a prescribed angle, and to guide the ions to the implantation process chamber 16. The angular energy filter 36 has an AEF electrode pair for deflection by an electric field. The AEF electrode pair is connected to high-voltage power supplies (not illustrated). In FIG. 2, the ion beam is deflected downward by applying a positive voltage to the upper AEF electrode and applying a negative voltage to the lower AEF electrode. The angular energy filter 36 may be configured to include a magnet device for deflection by a magnetic field, or may be configured to include a combination between the AEF electrode pair for electric field deflection and the magnet device.

In this way, the beamline device 14 supplies the ion beam to be used for irradiating the wafer W to the implantation process chamber 16.

The implantation process chamber 16 includes an energy slit 38, a plasma shower device 40, a side cup 42, a center cup 44, and the beam stopper 46, sequentially from the upstream side of the beamline A. As illustrated in FIG. 2, the implantation process chamber 16 includes a platen driving device 50 that holds one or more wafers W.

The energy slit 38 is provided downstream of the angular energy filter 36, and analyzes the energy of the ion beam incident into the wafer W together with the angular energy filter 36. The energy slit 38 is an energy defining slit (EDS) configured as a slit that is horizontally long in the beam scanning direction (x-direction). The energy slit 38 causes the ion beam having a desired energy value or a desired energy range to pass toward the wafer W, and blocks other ion beams.

The plasma shower device 40 is located downstream of the energy slit 38. The plasma shower device 40 supplies low-energy electrons to the ion beam and a surface of the wafer W (wafer processing surface) in accordance with a beam current of the ion beam, and suppresses charge-up of positive charges on the wafer processing surface which occurs due to ion implantation. For example, the plasma shower device 40 includes a shower tube through which the ion beam passes, and a plasma generation device that supplies electrons into the shower tube.

The side cup 42 (42R or 42L) is configured to measure the beam current of the ion beam during the ion implantation process into the wafer W. As illustrated in FIG. 2, the side cups 42R and 42L are disposed to be shifted to the right and left (x-direction) with respect to the wafer W disposed on the beamline A, and are disposed at positions at which the side cups 42R and 42L do not block the ion beam directed toward the wafer W during the ion implantation. The ion beam is subject to scanning in the x-direction beyond a range where the wafer W is located. Accordingly, a portion of the beam for the scanning is incident into the side cups 42R and 42L even during the ion implantation. In this manner, the beam current during the ion implantation process is measured by the side cups 42R and 42L.

The center cup 44 is configured to measure the beam current on the wafer processing surface. The center cup 44 is configured to be movable by an operation of a driving unit 45, is retreated from an implantation position where the wafer W is located during the ion implantation, and is inserted into the implantation position when the wafer W is not located at the implantation position. The center cup 44 measures the beam current while moving in the x-direction. In this manner, the center cup 44 can measure the beam current over the whole beam scanning range in the x-direction. As the center cup 44, a plurality of Faraday cups may be aligned in the x-direction to be formed in an array so that the beam currents can be simultaneously measured at a plurality of positions in the beam scanning direction (x-direction).

At least one of the side cup 42 and the center cup 44 may include a single Faraday cup for measuring the beam current, or may include an angle measurement device for measuring angle information of the beam. For example, the angle measurement device includes a slit and a plurality of current detectors provided away from the slit in the beam traveling direction (z-direction). For example, the angle measurement device can measure an angle component of the beam in the slit width direction by causing the plurality of current detectors aligned in the slit width direction to measure the beam which has passed through the slit. At least one of the side cup 42 and the center cup 44 may include a first angle measurement device capable of measuring angle information in the x-direction and a second angle measurement device capable of measuring angle information in the y-direction.

The platen driving device 50 includes a wafer holding device 52, a reciprocating mechanism 54, a twist angle adjusting mechanism 56, and a tilt angle adjusting mechanism 58. The wafer holding device 52 includes an electrostatic chuck or the like for holding the wafer W. The reciprocating mechanism 54 causes the wafer holding device 52 to reciprocate in a reciprocating direction (y-direction) perpendicular to the beam scanning direction (x-direction). In this manner, the wafer held by the wafer holding device 52 is caused to reciprocate in the reciprocating direction (y-direction). In FIG. 2, a reciprocating movement of the wafer W is indicated by an arrow Y.

The twist angle adjusting mechanism 56 adjusts a rotation angle of the wafer W. The twist angle adjusting mechanism 56 rotates the wafer W around a normal line of the wafer processing surface as an axis. In this manner, the twist angle adjusting mechanism 56 adjusts a twist angle between an alignment mark provided on an outer peripheral portion of the wafer and a reference position. Here, the alignment mark of the wafer means a notch or an orientation flat provided on the outer peripheral portion of the wafer, and means a mark that serves as a reference for an angular position in a crystal axis direction of the wafer or in a circumferential direction of the wafer. The twist angle adjusting mechanism 56 is provided between the wafer holding device 52 and the reciprocating mechanism 54, and is caused to reciprocate together with the wafer holding device 52.

The tilt angle adjusting mechanism 58 adjusts inclination of the wafer W, and adjusts a tilt angle between the traveling direction of the ion beam directed toward the wafer processing surface and the normal line of the wafer processing surface. In the present embodiment, out of inclination angles of the wafer W, an angle at which an axis in the x-direction is a rotation center axis is adjusted as the tilt angle. The tilt angle adjusting mechanism 58 is provided between the reciprocating mechanism 54 and an inner wall of the implantation process chamber 16, and rotates the whole platen driving device 50 including the reciprocating mechanism 54 in an R-direction. In this manner, the tilt angle adjusting mechanism 58 is configured to adjust the tilt angle of the wafer W.

The platen driving device 50 holds the wafer W so that the wafer W is movable between the implantation position where the wafer W is irradiated with the ion beam and a transfer position where the wafer W is loaded or unloaded between the platen driving device 50 and the wafer transfer device 18. FIG. 2 illustrates a state where the wafer W is located at the implantation position, and the platen driving device 50 holds the wafer W so that the beamline A and the wafer W intersect with each other. The transfer position of the wafer W corresponds to a position of the wafer holding device 52 when the wafer W is loaded or unloaded through a transfer port 48 by a transfer mechanism or a transfer robot provided in the wafer transfer device 18.

The beam stopper 46 is provided on the most downstream side of the beamline A, and is mounted on the inner wall of the implantation process chamber 16, for example. When the wafer W does not exist on the beamline A, the ion beam is incident into the beam stopper 46. The beam stopper 46 is located close to the transfer port 48 that connects the implantation process chamber 16 and the wafer transfer device 18 to each other, and is provided at a position vertically below the transfer port 48.

The ion implanter 10 further includes a control device 60. The control device 60 controls an overall operation of the ion implanter 10. The control device 60 is realized in hardware by elements such as CPUs and memories of a computer or mechanical devices, and in software by computer programs. Various functions provided by the control device 60 can be realized by cooperation between the hardware and the software.

Figure 3:
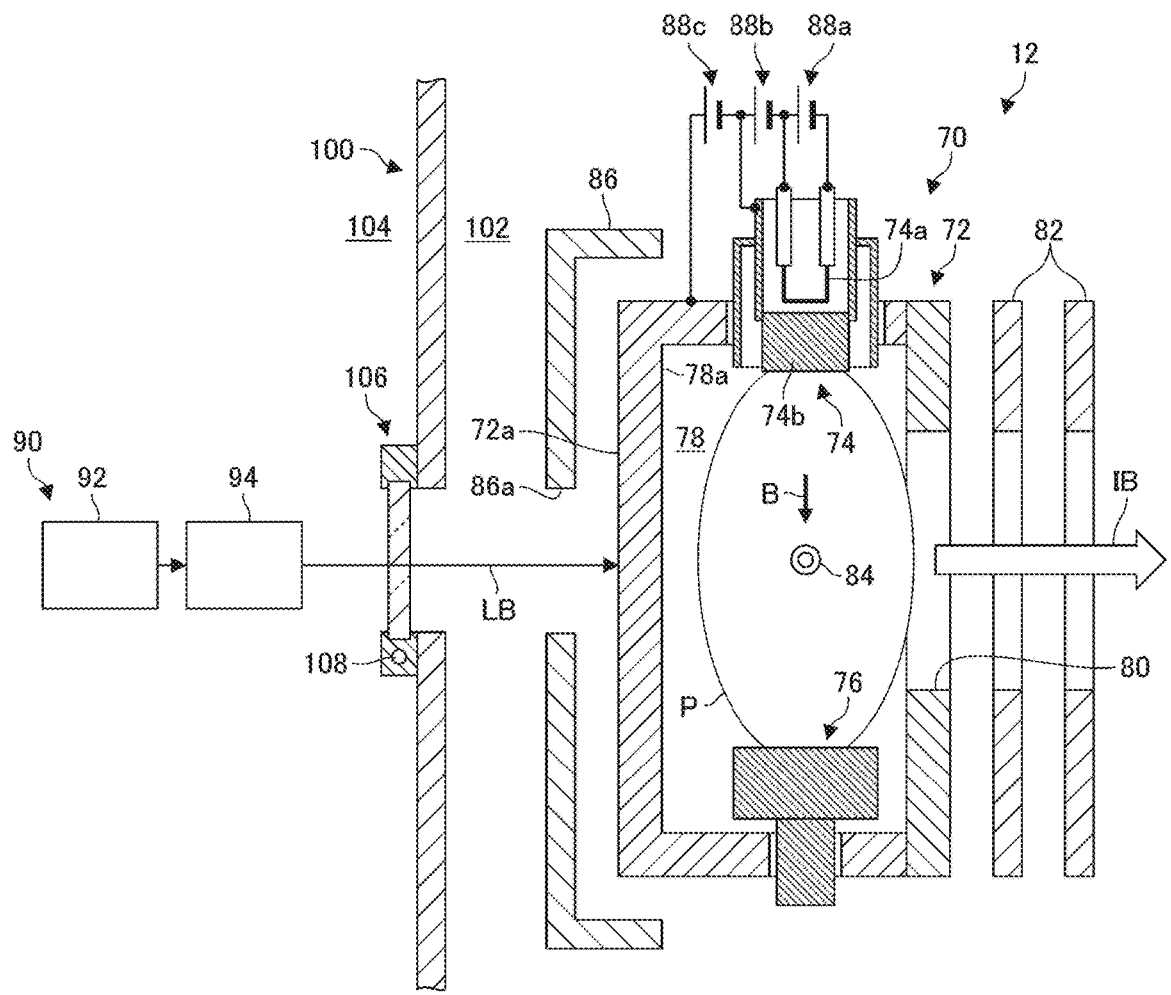
FIG. 3 is a view schematically illustrating a configuration of an ion generation device according to the embodiment.

FIG. 3 is a sectional view schematically illustrating a configuration of the ion generation device 12 according to the embodiment. The ion generation device 12 includes a plasma generation device 70 and a heating device 90.

The plasma generation device 70 includes an arc chamber 72 that defines the plasma generation chamber 78, and generates a plasma P containing ions inside the plasma generation chamber 78. The ions generated by the plasma generation device 70 are extracted by an extraction electrode 82 as an ion beam IB. The heating device 90 heats the arc chamber 72 by irradiating an outer surface 72a of the arc chamber 72 with a laser beam LB, and adjusts a temperature of the arc chamber 72.

The plasma generation device 70 is disposed in an inner portion 102 of a vacuum chamber 100. The heating device 90 is disposed in an outer portion 104 of the vacuum chamber 100. The arc chamber 72 is irradiated with the laser beam LB generated by the heating device 90 through a vacuum window 106 provided on a wall of the vacuum chamber 100. The vacuum window 106 is provided with a cooling flow path 108 through which a fluid (cooling water or the like) for cooling the vacuum window 106 passes.

The plasma generation device 70 includes the arc chamber 72, a cathode 74, and a repeller 76. The arc chamber 72 has a substantially rectangular parallelepiped shape. The arc chamber 72 defines the plasma generation chamber 78 in which the plasma P is generated. A slit 80 for extracting the ion beam IB is provided on a front surface of the arc chamber 72. The slit 80 has an elongated shape extending in a direction from the cathode 74 toward the repeller 76.

The arc chamber 72 is formed of a refractory material, and for example, is formed of refractory metal such as tungsten (W), molybdenum (Mo), or tantalum (Ta), an alloy thereof, or graphite (C). In this manner, it is possible to suppress damage caused by the heat of the arc chamber 72 in an environment where the inside of the plasma generation chamber 78 has a high temperature (for example, 700° C. to 2000° C.)

A reflector 86 is disposed outside the arc chamber 72. The reflector 86 is disposed to face an outer surface 72a of the arc chamber 72. The reflector 86 may be formed of the refractory material same as that of the arc chamber 72, or may be formed of a material different from that of the arc chamber 72. For example, as a material of the reflector 86, tungsten, molybdenum, graphite, stainless steel, or a ceramic material can be used. The reflector 86 functions to suppress temperature lowering in the arc chamber 72 due to thermal radiation by reflecting the thermal radiation from the outer surface 72a of the arc chamber 72 toward the arc chamber 72. The reflector 86 may function as a muffle for suppressing the heat loss from the arc chamber 72. The reflector 86 is provided with an irradiation port 86a through which the laser beam LB for irradiating the outer surface 72a of the arc chamber 72 passes. The reflector 86 may not be provided.

The cathode 74 emits thermal electrons into the plasma generation chamber 78. The cathode 74 is a so-called indirectly heated cathode (IHC), and has a filament 74a and a cathode head 74b. The filament 74a is heated by a filament power supply 88a to generate primary thermal electrons. A cathode power supply 88b is connected between the filament 74a and the cathode head 74b, and the primary thermal electrons generated by the filament 74a are accelerated by a cathode voltage. The cathode head 74b is heated by the accelerated primary thermal electrons from the filament 74a, and supplies secondary thermal electrons into the plasma generation chamber 78. An arc power supply 88c is connected between the arc chamber 72 and the cathode 74, and the secondary thermal electrons generated by the cathode head 74b are accelerated by an arc voltage.

The repeller 76 is provided at a position facing the cathode 74. The repeller 76 repels the secondary thermal electrons supplied into the plasma generation chamber 78 and electrons generated by ionization of source gas molecules inside the plasma generation chamber 78, and retains both of the electrons in the plasma generation chamber 78 so that generation efficiency of the plasma is improved.

A gas introduction port 84 is provided on a side wall of the arc chamber 72. The gas introduction port 84 supplies the source gas into the plasma generation chamber 78 from a gas cylinder or the like (not illustrated). As the source gas, rare gas, hydrides such as hydrogen ($H_2$), phosphine ($PH_3$), or arsine ($AsH_3$), or fluorides such as boron trifluoride ($BF_3$) or germanium tetrafluoride ($GeF_4$) are used. In addition, as the source gas, materials containing oxygen atoms (O) such as carbon dioxide ($CO_2$), carbon monoxide (CO), or oxygen ($O_2$) are also used.

A magnetic field B is applied to the plasma generation chamber 78 in a direction (or a direction opposite thereto) from the cathode 74 toward the repeller 76. The magnetic field B is generated by an electromagnet (not illustrated), and intensity of the magnetic field B is adjusted by changing a magnet current flowing in the electromagnet. The thermal electrons moving inside the plasma generation chamber 78 are restrained by the magnetic field B applied to the plasma generation chamber 78, and spirally moves along the magnetic field B. The electrons spirally moving in the plasma generation chamber 78 collide with the source gas molecules introduced into the plasma generation chamber 78, ionize the source gas molecules to generate the ions and new electrons, and generate the plasma P in the plasma generation chamber 78. By causing the electrons to move spirally in the plasma generation chamber 78, the generation efficiency of the plasma can be improved.

The heating device 90 includes a laser beam source 92 and an irradiation optical system 94. The laser beam source 92 generates a laser beam LB for heating the plasma generation device 70. The irradiation optical system 94 propagates the laser beam LB generated by the laser beam source 92 toward the plasma generation device 70.

The laser beam source 92 and the irradiation optical system 94 are disposed in the outer portion 104 of the vacuum chamber 100. At least a portion of the irradiation optical system 94 may be disposed in the inner portion 102 of the vacuum chamber 100, or the whole irradiation optical system 94 may be disposed in the inner portion 102 of the vacuum chamber 100. In addition, both the laser beam source 92 and the irradiation optical system 94 may be disposed in the inner portion 102 of the vacuum chamber 100. In this case, the vacuum chamber 100 may not be provided with the vacuum window 106. Alternatively, instead of providing the vacuum window 106, the laser beam LB may be propagated into the inner portion 102 of the vacuum chamber 100 by using an optical fiber extending from the outer portion 104 of the vacuum chamber 100 toward the inner portion 102 of the vacuum chamber 100.

The laser beam source 92 is configured to generate the laser beam LB of ultraviolet, visible, or near-infrared light included in a wavelength range from 200 nm to 2,000 nm, for example. A type of the laser beam source 92 is not limited, and for example, a small and easy-to-handle semiconductor laser can be used. The laser beam LB may be continuous light, or may be pulsed light. For example, a power of the laser beam source 92 is approximately 0.1 kW to 10 kW. As an example of the laser beam source 92, a semiconductor laser that emits the continuous light of 1 kW at a wavelength of 450 nm can be used. A metal material or graphite forming the arc chamber 72 has a high absorptivity of the light having a relatively short wavelength. Accordingly, the arc chamber 72 can be effectively heated by using the laser beam LB of the ultraviolet or visible (blue or green) light.

Figure 4A:
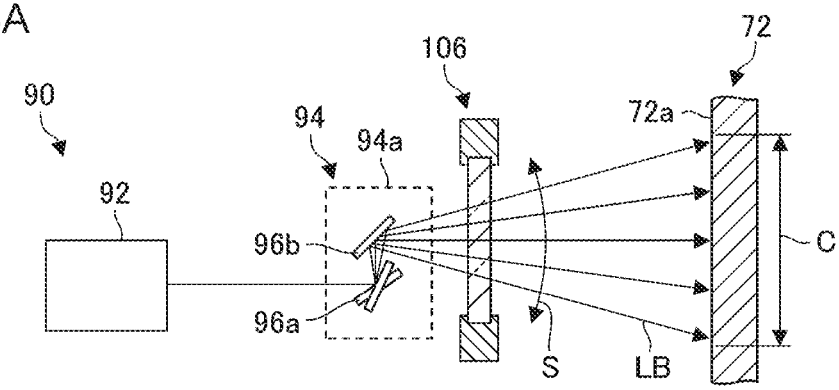
FIGS. 4A to 4C are views schematically illustrating configuration examples of irradiation optical systems.
Figure 4B:
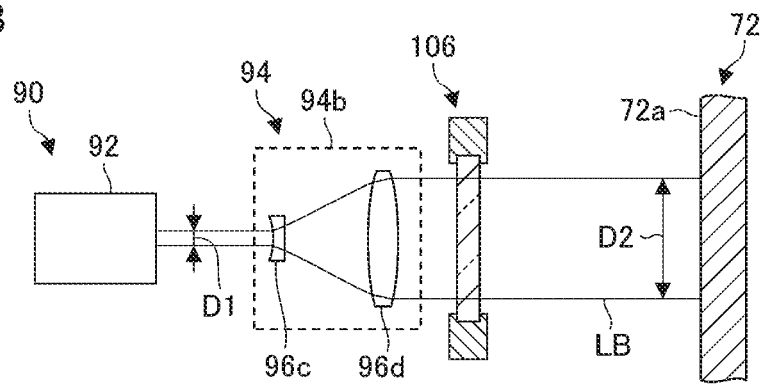
Figure 4C:
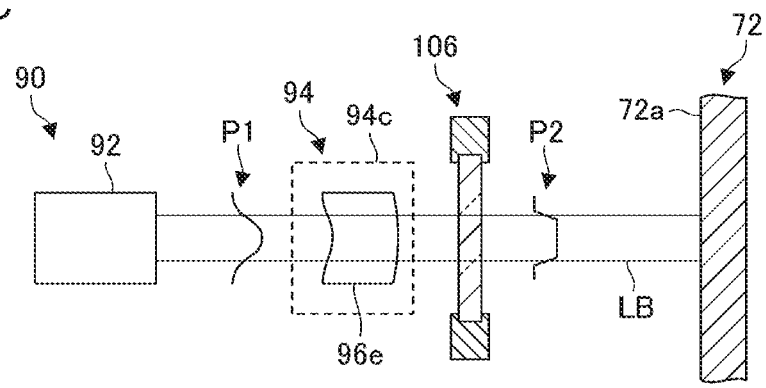

FIGS. 4A to 4C are views schematically illustrating configuration examples of the irradiation optical systems 94. The irradiation optical system 94 may include at least one of optical systems 94a, 94b, and 94c for adjusting beam characteristics such as an irradiation range, a beam diameter, and cross-sectional intensity distribution of the laser beam LB.

FIG. 4A illustrates a scanning optical system 94a for scanning and irradiating the outer surface 72a of the arc chamber 72 with the laser beam LB. The scanning optical system 94a has a first mirror 96a and a second mirror 96b for scanning with the laser beam LB. The laser beam LB from the laser beam source 92 is reflected by the first mirror 96a and the second mirror 96b, and is incident into the outer surface 72a of the arc chamber 72. The first mirror 96a is driven to change a reflection angle of the laser beam LB by the first mirror 96a. In this manner, scanning with the laser beam LB can be performed as illustrated by an arrow S. In this manner, an irradiation range C of the laser beam LB can be widened, and a larger region on the outer surface 72a of the arc chamber 72 can be more uniformly heated. Scanning with the laser beam LB may be performed by driving the second mirror 96b instead of the first mirror 96a. Scanning with the laser beam LB may be performed in one dimension, or may be performed in two dimensions. For example, both the first mirror 96a and the second mirror 96b are driven respectively in two directions perpendicular to each other. In this manner, the outer surface 72a of the arc chamber 72 can be scanned in two dimensions, and a larger region on the outer surface 72a of the arc chamber 72 can be more uniformly heated. Instead of driving a reflective optical element such as the mirror, scanning with the laser beam LB may be performed by driving a refractive optical element such as a prism.

FIG. 4B illustrates a magnification optical system 94b for magnifying the beam diameter of the laser beam LB and irradiating the outer surface 72a of the arc chamber 72 with the laser beam LB, of which the beam diameter is magnified. For example, the magnification optical system 94b has a first lens 96c and a second lens 96d. By using the magnification optical system 94b, the laser beam LB having a small beam diameter D1 which is emitted from the laser beam source 92 can be converted into the laser beam LB having a large beam diameter D2. In this manner, a larger region on the outer surface 72a of the arc chamber 72 can be irradiated with the laser beam LB, and the arc chamber 72 can be more uniformly heated. A reflective optical element such as a convex mirror or a concave mirror may be used instead of the refractive optical element such as the lens. The irradiation optical system 94 may include a reduction optical system for reducing the beam diameter. The irradiation optical system 94 may include a magnification-reduction optical system for magnifying or reducing the beam diameter.

FIG. 4C illustrates a beam shaping optical system 94c for adjusting the cross-sectional intensity distribution of the laser beam LB. The beam shaping optical system 94c converts the laser beam LB having a Gaussian type intensity distribution P1 emitted from the laser beam source 92 into the laser beam LB having a top-hat-like intensity distribution P2. For example, the beam shaping optical system 94c has an aspherical lens 96e called a homogenizer. The beam shaping optical system 94c may be configured to include any desired optical element, and may be configured to include a combination of a plurality of lenses and/or mirrors. The outer surface 72a of the arc chamber 72 is irradiated with the laser beam LB having the top-hat-like intensity distribution P2. In this manner, it is possible to prevent damage to the arc chamber 72 which is caused by local heating.

The irradiation optical system 94 may include two of the scanning optical system 94a, the magnification optical system 94b, and the beam shaping optical system 94c, or may include all three of the systems. For example, scanning with the laser beam LB whose beam diameter is magnified by the magnification optical system 94b and whose cross-sectional intensity distribution is made more uniform by the beam shaping optical system 94c may be performed by using the scanning optical system 94a. By combining the three optical systems 94a to 94c with each other, a larger region on the outer surface 72a of the arc chamber 72 can be irradiated with the laser beam LB having a more uniform intensity distribution. In this manner, the outer surface 72a of the arc chamber 72 can be still more uniformly heated.

Figure 5A:
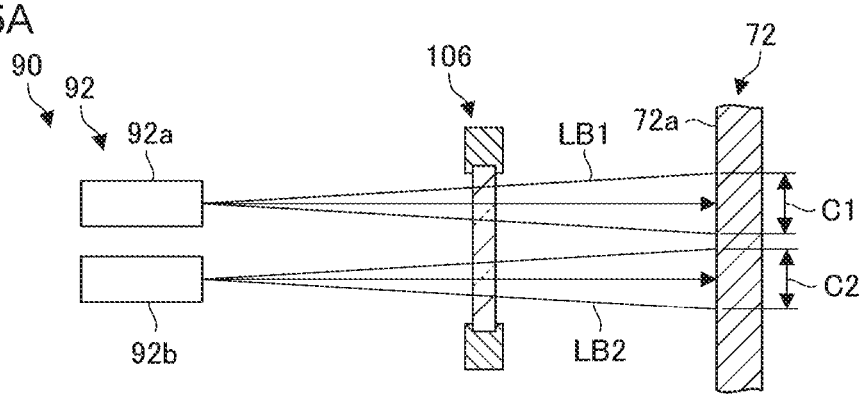
FIGS. 5A to 5C are views schematically illustrating configuration examples of laser beam sources.
Figure 5B:
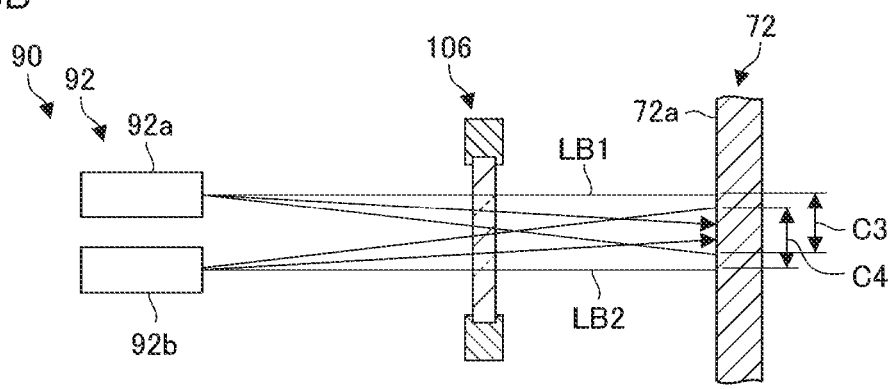
Figure 5C:
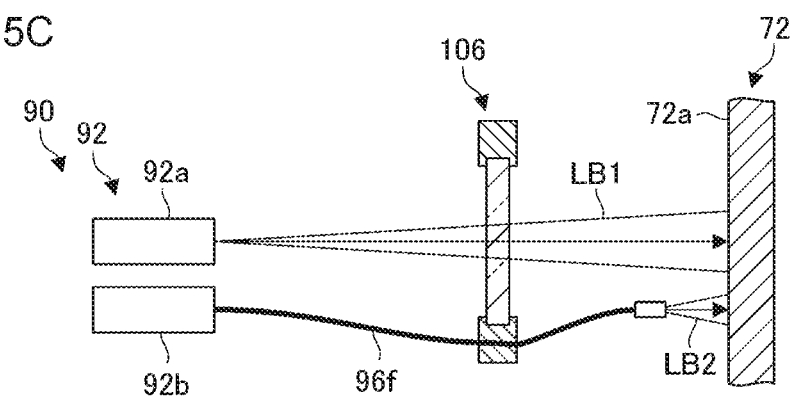

FIGS. 5A to 5C are views schematically illustrating a configuration example of the laser beam source 92, and illustrates a case where the heating device 90 includes two laser beam sources 92a and 92b. In the illustrated example, the two laser beam sources 92a and 92b are both disposed in the outer portion of the vacuum chamber. However, at least one of the two laser beam sources 92a and 92b may be disposed in the inner portion of the vacuum chamber.

FIG. 5A illustrates a case where mutually different irradiation ranges C1 and C2 are irradiated respectively with a first laser beam LB1 emitted from the first laser beam source 92a and a second laser beam LB2 emitted from the second laser beam source 92b. Therefore, mutually different regions on the outer surface 72a of the arc chamber 72 are irradiated respectively with the two laser beams LB1 and LB2 emitted from the two laser beam sources 92a and 92b. The mutually different irradiation ranges C1 and C2 are irradiated respectively with the laser beams LB1 and LB2 by using the two laser beam sources 92a and 92b. In this manner, a larger region on the outer surface 72a of the arc chamber 72 can be heated.

FIG. 5B illustrates a case where mutually overlapping irradiation ranges C3 and C4 are irradiated respectively with the first laser beam LB1 emitted from the first laser beam source 92a and the second laser beam LB2 emitted from the second laser beam source 92b. Therefore, the same region on the outer surface 72a of the arc chamber 72 is irradiated with at least a portion of the laser beam LB1 emitted from the laser beam sources 92a and at least a portion of the laser beam LB2 emitted from the laser beam source 92b in an overlapping manner. The overlapping range is irradiated with the laser beams LB1 and LB2 by using the two laser beam sources 92a and 92b. Accordingly, for example, it is possible to efficiently heat a part where the temperature is likely to be lowered due to thermal radiation.

FIG. 5C illustrates a case where the outer surface 72a of the arc chamber 72 is irradiated with the first laser beam LB1 emitted from the first laser beam source 92a through the vacuum window 106, and the outer surface 72a of the arc chamber 72 is irradiated with the second laser beam LB2 emitted from the second laser beam source 92b through an optical fiber 96f. In this configuration, for example, the first laser beam LB1 can be used to heat a relatively large region on the outer surface 72a of the arc chamber 72, and the second laser beam LB2 can be used to heat a relatively small region on the outer surface 72a of the arc chamber 72.

A part other than the outer surface 72a of the arc chamber 72 may be irradiated with the laser beam LB emitted from the heating device 90. Any desired member that defines the plasma generation chamber 78 may be irradiated with the laser beam LB, or any desired member exposed inside the plasma generation chamber 78 may be irradiated with the laser beam LB. An inner wall 78a of the plasma generation chamber 78 may be irradiated with the laser beam LB. At least one of the cathode 74 and the repeller 76 may be irradiated with the laser beam LB. The arc chamber 72 may have an irradiation port for irradiating an inner portion of the plasma generation chamber 78 with the laser beam LB. An optical fiber may be introduced into an inner portion of the arc chamber 72, and the cathode 74 and the repeller 76 may be irradiated with the laser beam LB through the optical fiber.

Figure 6:
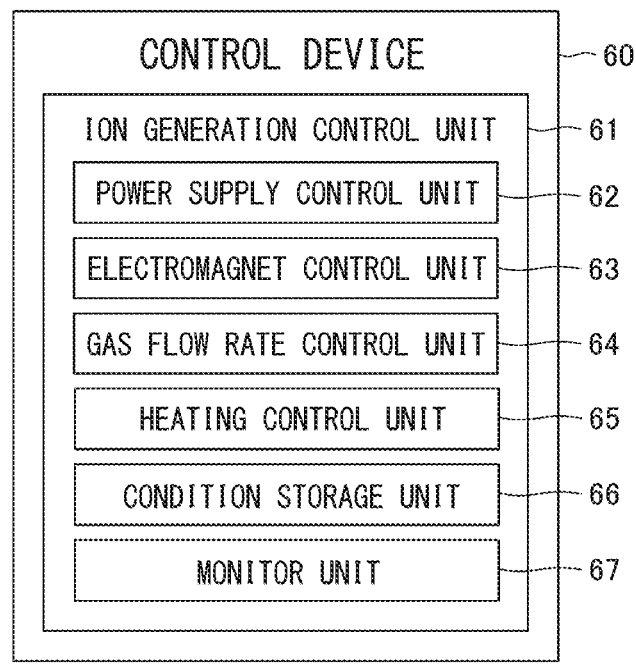
FIG. 6 is a view schematically illustrating a functional configuration of a control device according to the embodiment.

FIG. 6 is a view schematically illustrating a functional configuration of the control device 60 according to the embodiment. The control device 60 includes an ion generation control unit 61 for controlling an operation of the ion generation device 12. The ion generation control unit 61 includes a power supply control unit 62, an electromagnet control unit 63, a gas flow rate control unit 64, a heating control unit 65, a condition storage unit 66, and a monitor unit 67.

The power supply control unit 62 controls current values and voltage values of various power supplies such as the filament power supply 88a, the cathode power supply 88b, and the arc power supply 88c which are connected to the plasma generation device 70. The electromagnet control unit 63 controls intensity of the magnetic field B by adjusting the current value flowing through the electromagnet that applies the magnetic field B to the plasma generation chamber 78. The gas flow rate control unit 64 controls a flow rate of the source gas supplied from the gas introduction port 84.

The heating control unit 65 controls an operation of the heating device 90. The heating control unit 65 controls turning on/off of the laser beam source 92 and a power of the laser beam LB. For example, the heating control unit 65 turns on the laser beam source 92 when the temperature of the plasma generation chamber 78 needs to be raised, and turns off the laser beam source 92 when the temperature of the plasma generation chamber 78 does not need to be raised. The heating control unit 65 may control an operation of the irradiation optical system 94.

The condition storage unit 66 stores various parameters for determining operation conditions of the ion generation device 12. The condition storage unit 66 stores operation parameters for realizing implantation conditions such as an ion species, an ion charge state, an ion energy, and an ion current. For example, the condition storage unit 66 stores the operation parameters such as a filament current, a cathode current, a cathode voltage, an arc current, an arc voltage, a gas flow rate, and an electromagnet current. The power supply control unit 62, the electromagnet control unit 63, and the gas flow rate control unit 64 are operated in accordance with the operation parameters stored in the condition storage unit 66.

The monitor unit 67 acquires a measurement value which indicates an operation state of the ion generation device 12. For example, the monitor unit 67 acquires an arc current value of the arc chamber 72, a temperature of the arc chamber 72, an ion current value of the ion extracted from the ion generation device 12. For example, the measurement value acquired by the monitor unit 67 is used for the heating control unit 65 to control the operation of the heating device 90.

The ion generation control unit 61 controls density (also referred to as plasma density) of the plasma P generated in the plasma generation chamber 78 in order to generate the ions having the ion species, the ion charge state, and the ion current in accordance with the implantation conditions. For example, the ion charge state and the ion current of the generated ions can be increased by increasing the plasma density, and the ion charge state and the ion current of the generated ions can be decreased by decreasing the plasma density. In addition, optimum plasma density to realize a desired ion charge state and a desired ion current may vary, in accordance with a kind of the source gas and a kind of the ion to be extracted.

The plasma density inside the plasma generation chamber 78 is mainly controlled by the arc current, the arc voltage, the gas flow rate, and the magnetic field intensity. For example, the plasma density can be increased by increasing the values of them. Out of these, a magnitude of the arc current generated by the arc discharge inside the plasma generation chamber 78 and the plasma density inside the plasma generation chamber 78 substantially correspond to each other. Accordingly, the plasma density is controlled by mainly adjusting the arc current. The magnitude of the arc current can be adjusted by the filament current, the cathode current, the cathode voltage, the arc voltage, the gas flow rate, and the magnetic field intensity. However, in many cases, the magnitude of the arc current is controlled by the cathode voltage having better responsiveness. The plasma density can be controlled also by adjusting the gas flow rate. However, when the gas flow rate is too small or too large, the plasma generation becomes unstable. Therefore, in order to stably generate the plasma, it is necessary that the gas flow rate falls within a predetermined range. Accordingly, it is relatively difficult to adjust the plasma density by changing the gas flow rate.

When the plasma is generated by using the arc discharge, a relatively large amount of electric power needs to be applied to the arc chamber 72. Therefore, the arc chamber 72 has a high temperature (for example, 1,000° C. or higher). The temperature of the arc chamber 72 is mainly determined by a total amount of the input powers of the filament power supply 88a, the cathode power supply 88b, and the arc power supply 88c. Therefore, when the operation conditions are changed to control the plasma density so that the current values and the voltage values of various power supplies are changed, the temperature of the arc chamber 72 is also changed in response to a change in an input power amount. Heat capacity of the arc chamber 72 is relatively large. Accordingly, temperature responsiveness of the arc chamber 72 is low, and it takes time until the arc chamber 72 reaches a thermal equilibrium state. Especially in a high temperature state, the heat loss is significant due to the thermal radiation. Accordingly, a required time until the temperature of the arc chamber 72 is stabilized is lengthened in an operation condition of raising the temperature of the arc chamber 72. When the temperature of the arc chamber 72 is not stabilized, the plasma is also not stably generated in the plasma generation chamber 78, and stability of the ions extracted from the ion generation device 12 is also lowered. Therefore, in the present embodiment, the time until the arc chamber 72 reaches the thermal equilibrium state is shortened by using the heating device 90 to promote the temperature raising of the plasma generation chamber 78.

When the operation condition of the ion generation device 12 is switched from a low arc condition to a high arc condition, the heating control unit 65 turns on the laser beam source 92 so that the arc chamber 72 is irradiated with the laser beam LB. Here, the "low arc condition" means an operation condition in which the plasma density in the plasma generation chamber 78 is relatively low, and means an operation in which the arc chamber 72 in the thermal equilibrium state has a relatively low temperature since the input power amount is relatively low. On the other hand, the "high arc condition" means an operation condition in which the plasma density in the plasma generation chamber 78 is relatively high, and means an operation in which the arc chamber 72 in the thermal equilibrium state has a relatively high temperature since the input power amount is relatively high.

It may be relatively judged that a specific operation condition is either the low arc condition or the high arc condition. For example, it is conceivable to realize a case as follows. As a first operation condition, the plasma density is set to first density. As a second operation condition, the plasma density is set to second density higher than the first density. As a third operation condition, the plasma density is set to third density higher than the second density. In this case, when the operation condition is switched from the first operation condition to the second operation condition, the first operation condition is the "low arc condition" and the second operation condition is the "high arc condition". On the other hand, when the operation condition is switched from the second operation condition to the third operation condition, the second operation condition is the "low arc condition" and the third operation condition is the "high arc condition". Judgement that a specific operation condition is either the low arc condition or the high arc condition may be determined by whether or not the input power amount is equal to or higher than a predetermined threshold value.

When the operation condition is switched from the low arc condition to the high arc condition, the heating control unit 65 may change the operation of the heating device 90 in accordance with a difference between the operation conditions of the low arc condition and the high arc condition. For example, output power of the laser beam source 92 may be adjusted in accordance with a difference between the input power amount under the low arc condition and the input power amount under the high arc condition. For example, the power of the laser beam LB may be increased when the difference in the input power amounts is large, and the power of the laser beam LB may be decreased when the difference in the input power amounts is small. The heating control unit 65 may adjust an irradiation time of the laser beam LB in accordance with the difference in the input power amounts. For example, the heating control unit 65 may lengthen the irradiation time of the laser beam LB when the difference in the input power amounts is large, and may shorten the irradiation time of the laser beam LB when the difference in the input power amounts is small.

The heating control unit 65 may control the irradiation condition of the laser beam LB to be variable with a lapse of time, based on the measurement value acquired by the monitor unit 67. For example, the power of the laser beam LB may be gradually reduced in response to an increase in the plasma density in the plasma generation chamber 78 or an increase in the temperature of the plasma generation chamber 78. The heating control unit 65 may reduce the power of the laser beam LB as the arc chamber 72 approaches the thermal equilibrium state. In this manner, the heating control unit 65 may prevent the arc chamber 72 from being overheated. The heating control unit 65 may turn off the laser beam source 92 when the ion current of the ion extracted from the ion generation device 12 is stabilized.

When the operation conditions are switched, the ion generation control unit 61 may perform a cleaning operation to remove substances accumulated on the inner wall 78a of the plasma generation chamber 78. The substances corresponding to a kind of the source gas supplied to the plasma generation chamber 78 is accumulated on the inner wall 78a of the plasma generation chamber 78 as the ion generation device 12 is operated. When the kind of the source gas is changed to switch the ion species, the substances accumulated on the inner wall 78a before the switching are removed, and the substances corresponding to the kind of the source gas after the switching are accumulated. Accordingly, the substances accumulated on the inner wall 78a are replaced. Until the substances accumulated on the inner wall 78a are stabilized, a state of the plasma inside the plasma generation chamber 78 can be changed. Therefore, the ions cannot be stably extracted. By operating the ion generation device 12 under a cleaning condition, the removal of the substances accumulated on the inner wall 78a before the switching can be promoted, and the time until the substances accumulated on the inner wall 78a after the switching are stabilized can be shortened.

The condition storage unit 66 may store a cleaning operation condition as one of the operation conditions. Under the cleaning operation condition, in order to promote the removal of the substances accumulated on the inner wall 78a of the plasma generation chamber 78, the operation parameters are determined for the high arc condition. The cleaning operation condition may be determined so that the plasma density is higher than the other operation conditions.

The high density plasma is generated in the plasma generation chamber 78 under the cleaning operation condition. Accordingly, the plasma can strongly affect the substances accumulated on the inner wall 78a to promote the removal of the accumulated substance. In addition, since the cleaning is performed under the high arc condition, the temperature of the plasma generation chamber 78 can be raised, and the removal of the substances accumulated on the inner wall 78a can be promoted by means of evaporation or decomposition. Under the cleaning operation condition, as the source gas, it is desirable to use rare gas (for example, Ar or Xe) or highly reactive fluoride (for example, $BF_3$). When the rare gas is used, it is possible to prevent unnecessary substances from being accumulated on the inner wall 78a. In addition, when the highly reactive fluoride is used, the removal of the substances accumulated on the inner wall 78a can be promoted.

When the cleaning operation is performed, the heating control unit 65 may turn on the laser beam source 92 so that the arc chamber 72 is irradiated with the laser beam LB. The arc chamber 72 is heated by using the laser beam LB during the cleaning operation. In this manner, the temperature raising of the plasma generation chamber 78 can be promoted, and the removal of the substances accumulated on the inner wall 78a can be further promoted.

In a state where the plasma is not generated inside the plasma generation chamber 78, the heating control unit 65 may turn on the laser beam source 92 so that the arc chamber 72 is irradiated with the laser beam LB. For example, in a state where the plasma generation is stopped, the heating device 90 may be used to perform the cleaning operation for removing the substances accumulated on the inner wall 78a. In this case, the plasma generation may be stopped by stopping the supply of the source gas, or by turning off various power supplies.

In a state where plasma is generated inside the plasma generation chamber 78, the heating control unit 65 may turn on the laser beam source 92 so that the arc chamber 72 is irradiated with the laser beam LB. For example, when the operation condition is switched from the low arc condition to the high arc condition, the arc chamber 72 may be heated by the laser beam LB in a state where the plasma is generated under the high arc condition. In addition, the arc chamber 72 may be heated by the laser beam LB in a state where the plasma is generated under the cleaning operation condition.

The heating control unit 65 may control the operation of the heating device 90 to suppress fluctuations in the temperature of the plasma generation chamber 78 which are caused by the difference in the arc conditions. For example, the power of the laser beam LB may be increased when the plasma is generated under the low arc condition, and the power of the laser beam LB may be decreased when the plasma is generated under the high arc condition. In this manner, a difference between the temperature of the plasma generation chamber 78 under the low arc condition and the temperature of the plasma generation chamber 78 under the high arc condition may be reduced.

When the ion generation device 12 is started up from a non-operation state to an operation state, the heating control unit 65 may heat the arc chamber 72 by irradiating the arc chamber 72 in a low temperature state having an approximate room temperature with the laser beam LB. In this case, the arc chamber 72 may be irradiated with the laser beam LB in a state where the plasma is not generated inside the plasma generation chamber 78. The plasma generation chamber 78 is irradiated with and heated by the laser beam LB. In this manner, it is possible to promote the switching from a state where the plasma is not generated inside the plasma generation chamber 78 to a state where the plasma is generated inside the plasma generation chamber 78.

According to the present embodiment, the plasma generation chamber 78 is heated by using the laser beam LB. In this manner, it is possible to promote the temperature raising of the plasma generation chamber 78 regardless of the arc condition for generating the plasma. It is possible to intentionally increase the input power amount to the plasma generation chamber 78 to give priority to the temperature raising of the plasma generation chamber 78. However, the input power amount has an upper limit. In addition, when the input power amount is unnecessarily increased, there is a possibility of an adverse effect in that components forming the plasma generation device 70 may deteriorate. In the present embodiment, the temperature of the plasma generation chamber 78 can be more flexibly controlled by providing the heating device 90 independent of various power supplies 88a to 88c connected to the plasma generation device 70. For example, even when the input power amount optimized from a viewpoint of stably generating the plasma is maintained, the temperature raising of the plasma generation chamber 78 can be promoted by using the heating device 90, and it is possible to shorten a waiting time until a desired operation state is realized. In this manner, it is possible to shorten a non-operation time of the ion implanter 10, and to improve productivity of the ion implanter 10.

Hitherto, the present invention has been described with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various changes such as design changes can be added to the embodiment. The embodiment having such modifications can also be included in the scope of the present invention.

It should be understood that the invention is not limited to the above-described embodiment, but may be modified into various forms on the basis of the spirit of the invention. Additionally, the modifications are included in the scope of the invention.

What is claimed is:

1. An ion generation device comprising:
   a vacuum chamber;
   an arc chamber disposed inside the vacuum chamber, wherein the arc chamber defines a plasma generation chamber in which a plasma is generated and has a slit for extracting an ion from the plasma generation chamber; and
   a heating device that includes a laser beam source disposed outside the vacuum chamber, wherein the laser beam source is configured to heat the plasma generation chamber by irradiating an outer surface of the arc chamber with a laser beam emitted from the laser beam source through a vacuum window provided on a wall of the vacuum chamber,
   wherein the vacuum window is configured to be cooled by a fluid flowing through a cooling flow path provided around the vacuum window.

2. The ion generation device according to claim 1, wherein the heating device includes a scanning optical system for irradiating the outer surface of the arc chamber with the laser beam with scanning.

3. The ion generation device according to claim 1, wherein the heating device includes a magnification-reduction optical system for irradiating the outer surface of the arc chamber with the laser beam having a magnified or reduced beam diameter.

4. The ion generation device according to claim 1, wherein the heating device includes a beam shaping optical system for irradiating the outer surface of the arc chamber with the laser beam having a top-hat-like cross-sectional intensity distribution.

5. The ion generation device according to claim 1, wherein the heating device includes a plurality of laser beam sources, and mutually different regions on the outer surface of the arc chamber are irradiated with a plurality of the laser beams emitted from the plurality of laser beam sources.

6. The ion generation device according to claim 1, wherein the heating device includes a plurality of laser beam sources, and the same region on of the outer surface of the arc chamber is irradiated in a superimposed manner with a plurality of the laser beams emitted from the plurality of laser beam sources.

7. The ion generation device according to claim 1, further comprising:
   a reflector provided outside the plasma generation chamber, and configured to reflect thermal radiation from the outer surface of the arc chamber toward the arc chamber.

8. The ion generation device according claim 1, wherein the laser beam is irradiated onto a portion of the outer surface of the arc chamber on the opposite the slit across the plasma generation chamber.

9. The ion generation device according claim 1, wherein the arc chamber has a gas introduction port for introducing a source gas into the plasma generation chamber, and
   wherein the plasma of the source gas is generated in the plasma generation chamber.

10. An ion generation method comprising:
    heating a plasma generation chamber by irradiating a member that defines the plasma generation chamber or a member that is to be exposed to a plasma generated inside the plasma generation chamber with a laser beam;
    extracting an ion from the plasma generated inside the plasma generation chamber; and
    monitoring at least one of a state of the plasma generated inside the plasma generation chamber, a temperature of the plasma generation chamber, and an ion current of the extracted ion,
    wherein based on a result of the monitoring, an irradiation condition of the laser beam is variable with respect to a lapse of time, and
    wherein a power of the laser beam is reduced in response to an increase in a density of the plasma generated inside the plasma generation chamber, or in response to an increase in a temperature of the plasma generation chamber.

11. The ion generation method according to claim 10, wherein a plasma density inside the plasma generation chamber is switched from a first density to a second density higher than the first density with heating by irradiating the plasma generation chamber with the laser beam.

12. The ion generation method according to claim 10, wherein substances accumulated on an inner wall of the plasma generation chamber are removed with heating by irradiating the plasma generation chamber with the laser beam.

13. The ion generation method according to claim 10, wherein heating the plasma generation chamber includes irradiating the plasma generation chamber with the laser beam in a state where the plasma is not generated inside the plasma generation chamber.

14. The ion generation method according to claim 10, wherein heating the plasma generation chamber includes irradiating the plasma generation chamber with the laser beam in a state where the plasma is generated inside the plasma generation chamber.

15. The ion generation method according to claim 10, wherein the plasma generation chamber is heated by being irradiated with the laser beam to switch a state where the plasma is not generated inside the plasma generation chamber to a state where the plasma is generated inside the plasma generation chamber.

\* \* \* \* \*